United States Patent [19]
Cox et al.

[11] Patent Number: 6,154,868
[45] Date of Patent: Nov. 28, 2000

[54] METHOD AND MEANS FOR COMPUTATIONALLY EFFICIENT ON-THE-FLY ERROR CORRECTION IN LINEAR CYCLIC CODES USING ULTRA-FAST ERROR LOCATION

[75] Inventors: Charles Edwin Cox; Myron Dale Flickner; James Lee Hafner, all of San Jose; Martin Aureliano Hassner, Palo Alto, all of Calif.; Barry Marshall Trager, Yorktown Heights; Shmuel Winograd, Scarsdale, both of N.Y.

[73] Assignee: International Business Machines Corporation, Armonk, N.Y.

[21] Appl. No.: 08/896,348

[22] Filed: Jul. 18, 1997

[51] Int. Cl.[7] .................................................. H03M 13/00
[52] U.S. Cl. ........................................... 714/784; 714/785
[58] Field of Search .................................. 714/784, 785, 714/781

[56] References Cited

U.S. PATENT DOCUMENTS

| | | | |
|---|---|---|---|
| 4,841,300 | 6/1989 | Yoshida et al. | 341/94 |
| 5,136,538 | 8/1992 | Karmarkar et al. | 364/754 |
| 5,428,628 | 6/1995 | Hassner et al. | 371/37.1 |
| 5,889,792 | 3/1999 | Zhang et al. | 371/37.11 |

OTHER PUBLICATIONS

E. R. Berlekamp, "Algebraic Coding Theory", *McGraw–Hill Publishing Co.*, 1968, pp. 176–199.

R. T. Chien, "Cyclic Decoding Procedures for Bose–Chaudhuri–Hocquenghem Codes", *IEEE Transactions on Information Theory*, vol. 10, Oct. 1964, pp. 357–363.

G. C. Clark, Jr., et al., "Error–correction Coding for Digital Communications", *Plenum Press, Inc.*, 1981, pp. 189–215.

G. D. Forney, Jr., "On Decoding BCH Codes", *IEEE Transactions on Information Theory*, vol. 11, Oct. 1965, pp. 549–557.

T. Horiguchi, "High–speed Decoding of BCH Codes Using a New Error–evaluation Algorithm", *Electronics and Communications in Japan Part 3*, vol. 72, No. 12, 1989, pp. 63–71.

*Primary Examiner*—Albert De Cady
*Assistant Examiner*—Esaw Abraham
*Attorney, Agent, or Firm*—R. Bruce Brodie; Marc D. McSwain

[57] ABSTRACT

A computationally efficient, machine-implementable method and means for detecting and correcting errors in received codewords on-the-fly within the capacity of a linear cyclic code using ultra-fast error location processing. Each error locator polynomial of degree t over a finite Galois field derived from a codeword syndrome is mapped into a matrix representative of a system of linear simultaneous equations related to the polynomial coefficients. Roots indicative of error locations within the codeword are extracted from the matrix by a modified Gaussian Elimination process for all the roots where $t \leq 5$ and at least one root plus a subset of candidate roots from the finite field for iterative substitution where $t > 5$. Corrected values are separately determined and correction is secured by logically combining the corrected values with the codeword values in error at the error locations represented by the roots.

3 Claims, 6 Drawing Sheets

ERROR LOCATOR POLYNOMIAL ROOT SOLVING OVER A FINITE (GALOIS) FIELD

FIG. 1  PARTIAL READ AND WRITE PATH DATA FLOW IN A DIRECT ACCESS STORAGE DEVICE (PRIOR ART)

FIG. 2  ECC READ PROCESSOR (PRIOR ART)

ECC PROCESSING IN DASD READBACK PATH

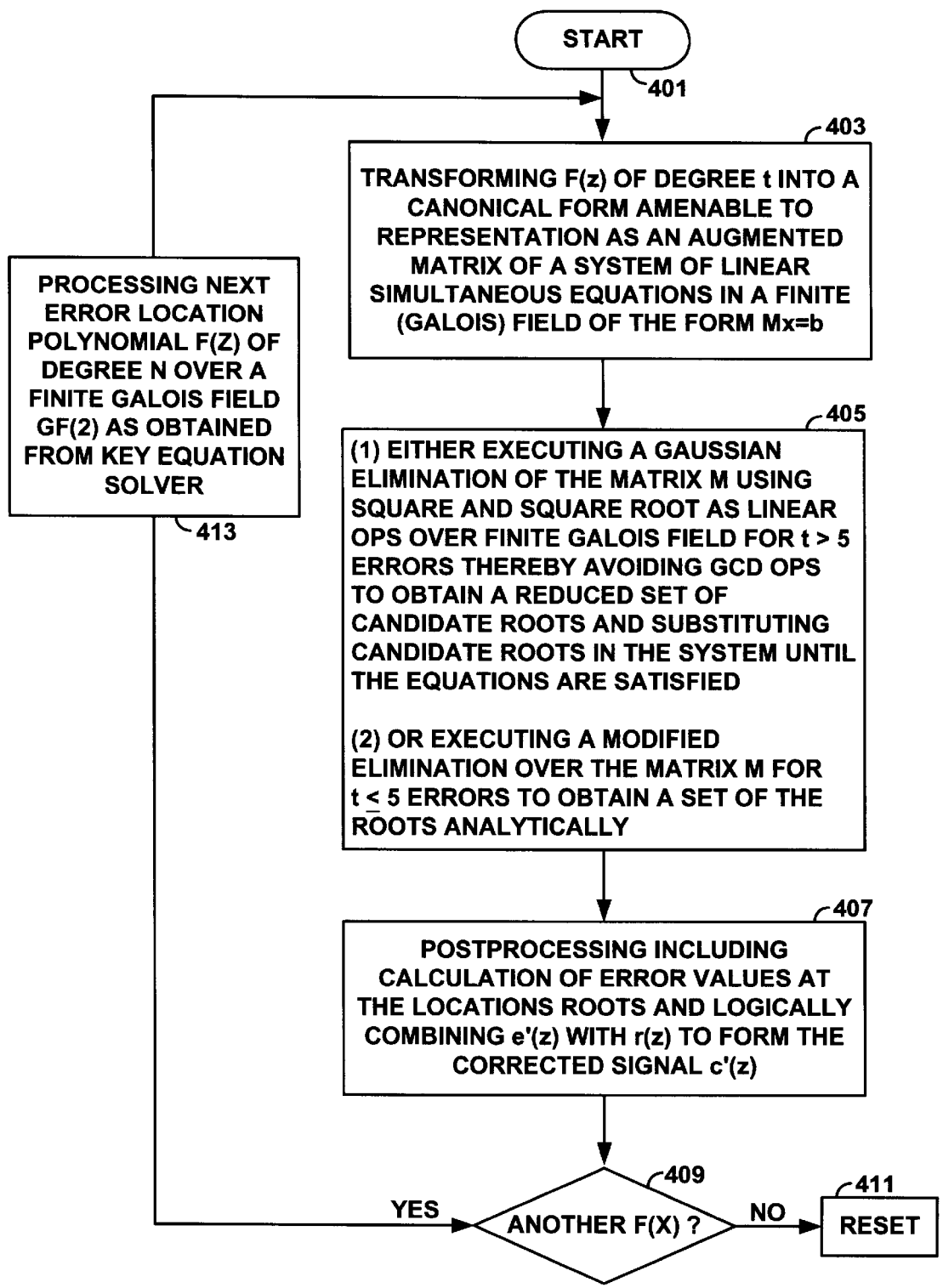
FIG. 4    ERROR LOCATOR POLYNOMIAL ROOT SOLVING OVER A FINITE (GALOIS) FIELD

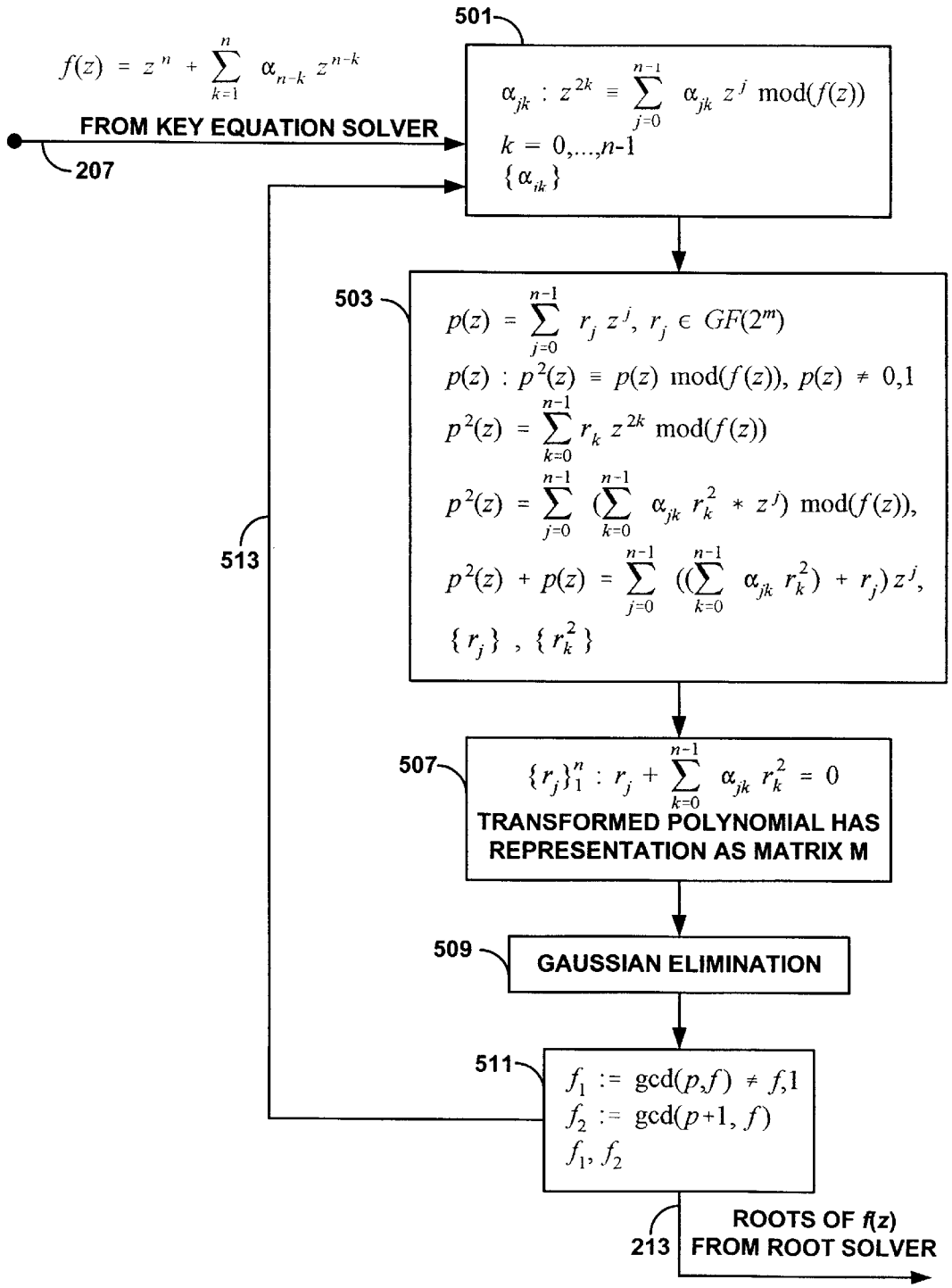
FIG. 5A  GAUSSIAN ELIMINATION FACTORIZATION STEP

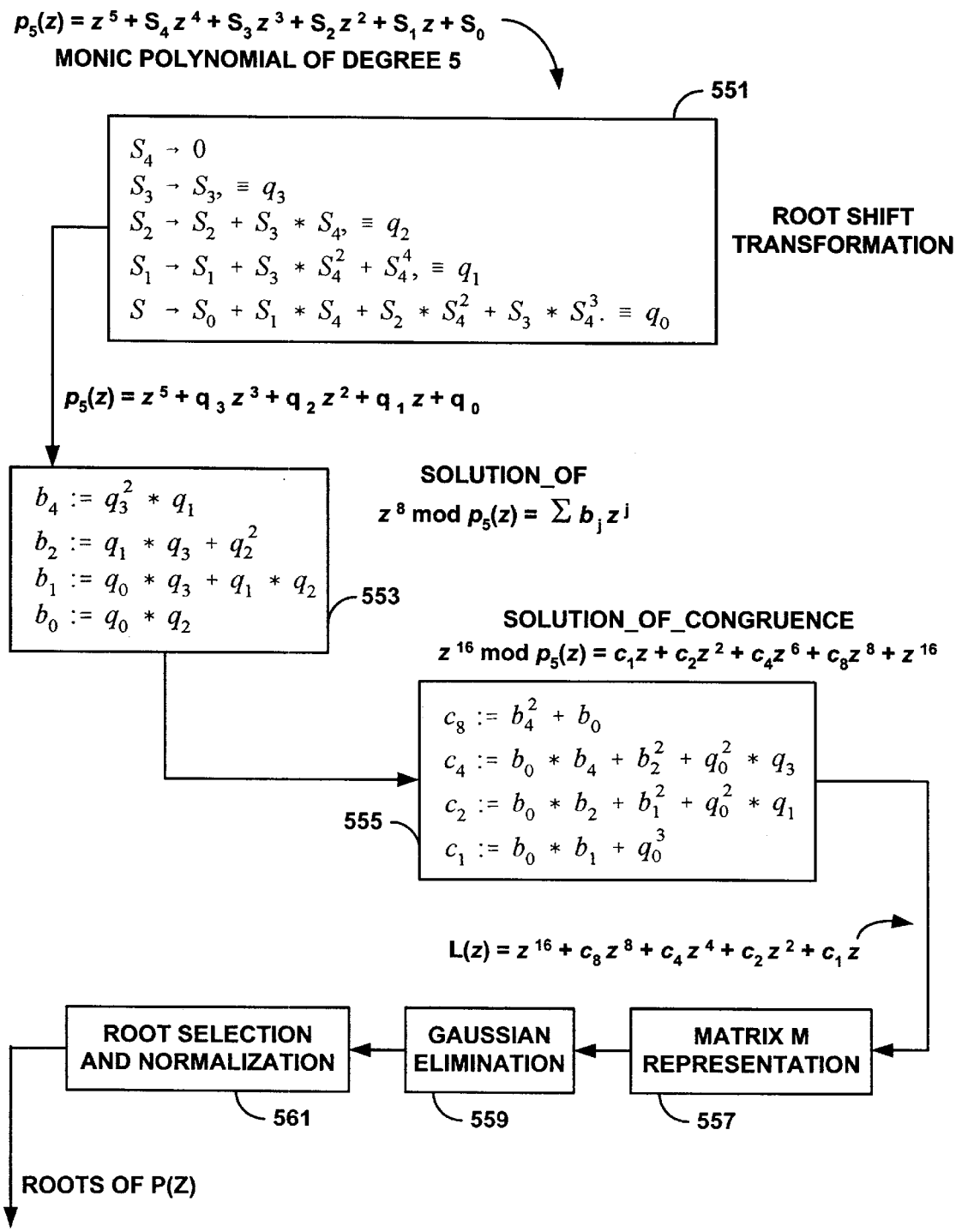
FIG. 5B — FACTORIZATION OF A QUINTIC EQUATION BY GAUSSIAN ELIMINATION

METHOD AND MEANS FOR COMPUTATIONALLY EFFICIENT ON-THE-FLY ERROR CORRECTION IN LINEAR CYCLIC CODES USING ULTRA-FAST ERROR LOCATION

FIELD OF THE INVENTION

This invention relates to methods and means for detecting and correcting up to t errors in linear cyclic codewords on the fly. More particularly, the invention relates to methods and means for the ultra-fast resolution of t error locations in each affected codeword from a counterpart degree t error locator polynomial, the polynomial being derived from syndromes processed in a data streaming environment such as an optical or magnetic storage subsystem read channel or the like.

DESCRIPTION OF RELATED ART

Data Streaming, Moving Magnetic Storage, and Synchronism

It is well known that applications executing on a multi-tasking CPU, such as an IBM 390 running under an MVS operating system, can randomly or sequentially update tracks of data recordable on one or more IBM 3390 direct access storage devices (DASDs). The transfers to the DASDs are made via an attached IBM 3990 cache-based staged storage subsystem. The transfer of data between the CPU and the IBM 3990 cache and between the 3990 and any one of the 3390 DASDs are data streaming operations. In this regard, data streaming is a point-to-point uninterrupted movement of data serial by bit or serial by character or codeword in order to achieve high data transfer rates.

It should also be appreciated that a DASD includes a cyclic multitracked magnetic storage medium and an access mechanism. The access mechanism, in turn, includes a writing transducer for mapping the binary digital codewords into time-varying magnetic flux streams onto addressed tracks and a reading transducer for the inverse mapping. Reading a DASD track involves executing an analog-to-digital mapping of the time-varying flux changes created by the magnetized track moving past the read transducer into binary digital codewords. It further involves testing of the codewords as to whether they are the same as those originally recorded. Significantly, the disk storage medium is rotating at a constant angular rate, and this imposes a time constraint on the read path processing. In order for the processing of data copied from the disk to perform as a synchronous system, then t selected actions or events coincide in time. This means that the processing of data copied from the disk must complete the handling of a current codeword in time for the next codeword to be read and processed. That is, the processing must be completed no later than the recorded track image of the next codeword that passes under the DASD read transducer.

Some Attributes of Linear Cyclic Codes, Codewords, and Error Detection

Typically, digital data is written out to DASD tracks as sequences of codewords drawn from a linear block or cyclic error correction code. Upon being read back from DASD, these codewords can be tested for any errors or erasures and corrections made thereto before passing it further on.

Reference should be made to copending Hassner et al. application Ser. No. 08/838,375, filed Apr. 8, 1997, entitled, "Method and Means for Computationally Efficient Error and Erasure Correction in Linear Cyclic Codes". In the Hassner case, a Reed-Solomon (RS) code is used to exemplify linear cyclic codes. Also, the RS code finds use in communication and storage because it maintains maximum distance among codewords for a given codeword length n. In this regard, the term "distance" means the number of bit changes that must be made to a first codeword such that it would appear to be the same as another codeword in the code set for a given amount of checking overhead.

As Hassner et al. explained, an RS code is one in which every codeword $c(z)$ in an (n,k) linear cyclic code over $GF(2^m)$ is generated by dividing a block of data $m(z)$ by a generator polynomial $g(z)$ and adding the remainder thereto to modulo 2. Relatedly, $c(z)$ is a polynomial of degree $n-1$ or less, where $$m(z)=m_0+m_{1\times 1}+m_{2\times 2}+ \ldots +m_{(n-r-1)\times(n-r-1)}$$

and where $$g(z)=g_0+g_{1\times 1}+g_{2\times 2}+ \ldots +g_{r\times r},$$

such that $$c(z)=m(z)/g(z)+\text{remainder}.$$

It should be recalled that codewords are conventionally represented as a collection of coefficients of a rational polynomial of an arbitrary place variable z in low-to-high order.

Significantly, a received or read back codeword is $r(z)=c(z)+e(z)$ where $c(z)$ was the codeword originally transmitted or recorded and $e(z)$ is the error. Relatedly, a syndrome polynomial $S(z)$ is informally defined as $S(z)=r(z) \mod g(z)$. Thus, $r(z)=c(z)$ if and only if $g(z)$ divides into $r(z)$ with a remainder of zero, i.e., $S(z)=0$. Otherwise, it can be shown that $S(z)$ is dependent only on the error function $e(z)$ such that $S(z)=e(z) \mod g(z)$.

Aspects of Reed Solomon Codes

An RS code may be said to comprise a set of vectors over a finite field F having $p^m$ elements, where p is a prime number. The elements of the field F are identified with either of two attributes. That is, they are identified with the $p^m-1$ powers of a distinct element "a" and the symbol "0". Alternatively, they are identified with the set of polynomials of degree of at most $m-1$ and with the coefficients in the field of integers modulo p. For purposes of convenience, let $p^m=2^8=256$ such that the field F is fixed at $F_{256}$. In this RS code, all operations are performed modulo 2. The field $F_{256}$ can be constructed from the primitive polynomial $$p(z)=z^8+z^6+z^5+z+1$$

with coefficients in GF(2) and where "a" is a primitive root of the irreducible polynomial p(z).

The defining property of an RS code C is that all vectors $c=(c_0,c_1, \ldots ,c_{254}) \in C$ satisfy the relations for a given set of numbers j:

$$\sum_{k=0}^{k=254} c_k a^{jk} = 0 \mod p(z)$$

In this example, $j \in \{0,1, \ldots, 7\}$. Also, the positions within a codeword may be indexed by the nonzero elements of the field $a^0, a^1, \ldots, a^{254}$. That is, $c(z)=0$ where $z=a^j$.

Illustratively, assume that errors occurred in predetermined positions in a received codeword are indexed by $\{a^5, a^{13}, a^{28}, a^{29}, a^{124}, a^{136}\}$ and the corresponding error values are $\{a^4, a^5, a^{123}, a^3, a^2, a^0\}$. Thus, if a syndrome from the received codeword r is determined from:

$$\sum_{k=0}^{k=254} c_k a^{jk} = 0 \bmod p(z)$$

then the nonzero syndromes in the example would be $S_0=a^{86}$, $S_1=a^{235}$, $S_3=a^{45}$, $S_4=a^{205}$, $S_5=a^{239}$, $S_6=a^{113}$, and $S_7=a^{173}$.

Berlekamp and Horiguchi References

In the prior art as expressed in E. R. Berlekamp, "Algebraic Coding Theory", by McGraw-Hill Publishing Co., 1968, pages 178–199, Berlekamp showed that if a linear error correction code had a distance 2t +1 between codewords, then the syndrome S(z) over a codeword c(z) could be expressed formally as the recursion:

$$\sum_{k=0}^{k=254} c_k a^{jk} = 0 \bmod p(z)$$

where z is a polynomial presentation of the codeword c(z), w(z) is the error evaluator polynomial, and σ(z) is the error locator polynomial. This has been denominated as the "key equation". Relatedly, Berlekamp showed that the locations of errors within a received codeword r are determined by the index positions j of $a^j$ as the roots of the locator polynomial $\sigma(z)=\sigma(a^k)=0$. Note, in this specification, the terms "σ(z)" and "f(z)" are used interchangeably to designate the error locator polynomial.

Toshio Horiguchi of NEC Corporation wrote a seminal paper entitled "High Speed Decoding of BCH Codes Using a New Error Evaluation Algorithm", published in *Electronics and Communications In Japan Part* 3, Vol. 72, No. 12, 1989. Scripta Technica, Inc., made an English language translation available in 1990.

In this article, Horiguchi pointed out that decoding and error processing a linear cyclic code, such as a Reed-Solomon (RS) code, requires several broad steps. The first step is that of syndrome determination decoding, while the remaining steps ascertain various factors in the key equation. In the first step, the syndrome set $\{S_j\}$ is derived. Next, the error locator polynomial σ(z) and the error evaluator polynomial w(z) are computed. This is followed by ascertaining the error locations $\{l_k\}$ using the method of Chien and the computation of the error values $\{e_k\}$ using the method of Forney. Parenthetically, Chien's method for solving σ(z) was published in an article entitled "Cyclic Decoding Procedures for the BCH Codes", *IEEE Transactions on Information Theory*, Vol. 10, October 1964, pp. 357–363. Likewise, Forney published his mode of estimating w(z) in "On Decoding BCH Codes", *IEEE Transactions on Information Theory*, Vol. 11, October 1965, pp. 547–557.

One drawback of the prior art root solvers was reliance on iterative substitution of all values in a finite Galois field to ascertain which would solve the system of equations. Such an approach becomes unmanageable for real-time applications involving high degree polynomials and on-the-fly task completion. This certainly occurs in the synchronous correction of codewords in error streaming from a continuous source.

SUMMARY OF THE INVENTION

It is an object of this invention to devise a computationally efficient machine-implementable method and means for detecting and correcting errors and erasures in received codewords on-the-fly within the capacity of a linear cyclic code using ultra-fast error location processing.

It is a related object to devise a machine-implementable method and means where the linear cyclic code is of the Reed-Solomon type, and the received codewords are read back from selected tracks from a moving multitracked magnetic storage device or from a helically tracked optical storage device or the like.

It is yet another object to devise a machine-implementable method and means for ascertaining exact roots for a monic algebraic polynomial equation of low degree in a finite field, and for reducing the number of candidate root values for a polynomial equation of high degree within a finite field, a monic polynomial being a polynomial with a leading coefficient of +1.

The foregoing objects are believed satisfied by a machine-implementable method and means for correcting up to t errors in words defined over a linear cyclic code and received from a communications subsystem or read back from a storage subsystem or the like. In this regard, the code has up to a maximum number of consecutive zero or null values occurring in said code definition. In the method and means, each received word is subject to separate processing for location and value of errors.

More particularly, the method of the invention comprises the steps of deriving one or more syndromes from each received codeword and computing a counterpart error locator polynomial f(z) of degree t from the derived syndromes. Next, the polynomial f(z) is mapped into a canonical form as an augmented matrix M of a system of m linear simultaneous equations in a finite Galois field GF($2^m$). After this, at least one exact root is extracted as are a subset of the finite Galois field as root candidates. The extraction is attained by a Gaussian Elimination process using selective exponentiation as a linear operator over the Galois field GF($2^m$). The remaining roots are determined by iteratively substituting the candidates in the system of equations until the equations are satisfied. Lastly, error values are determined from the syndromes at locations in the received word specified by the extracted roots of the counterpart error locator polynomial. Parenthetically, M is an m×m matrix with entries in GF(2).

Where the error locator polynomial f(z) is of degree (t≦5), then according to the method and means of this invention, the polynomial could be mapped relatively directly into the augmented matrix M representation of a system of m linear simultaneous equations and all the roots extracted by Gaussian Elimination. That is, for error polynomials expressed as monic algebraic polynomial equations of degree five or less, the mapping of this invention can be executed with limited computation resource. However, where the degree of the error locator polynomial exceeds five, then the output of the Gaussian Elimination is a mix of at least one solution/root and a subset of candidate solutions or roots drawn from the set of all the values in a given-sized finite Galois field. It is then necessary to iteratively substitute the candidate values, noting the ones that constitute solutions. This still constitutes a substantial processing reduction over a trial-and-error search over all possible values for each received codeword in error.

Restated, the method and means of this invention resolve the roots of an error locator polynomial with computational efficiency in order to maintain synchronous data flow of corrected ECC codewords by converting each locator polynomial into a matrix representation of a system of linear equations, including the use of squaring as a linear operation finding the solutions using Gaussian Elimination, exactly for all solutions for low degree polynomials and for higher degree polynomials using the conversion+Gaussian Elimination to resolve some roots and produce a small subset for the remaining candidates from the finite field of interest to iteratively substitute. In virtually all cases, a post-Gaussian Elimination step is required to renormalize the solutions so that they constitute roots of the original error polynomial in time for their use in modifying the codeword being evaluated.

BRIEF DESCRIPTION OF THE DRAWING

FIG. 4 exhibits a general flow of control of the method for finding roots (codeword error locations) in the t degree error locator polynomials over a finite (Galois) field as executed in the root solver portion of the ECC read processor.

FIG. 5A shows the information processing and operations of the general method of the invention emphasizing Gaussian Elimination matrix processing in a finite Galois field performed upon the error locator polynomial output of the key equation solver for determining the roots as the locations of the errors in the counterpart received word.

FIG. 5B sets forth a modified Gaussian Elimination processing suitable for an error locator polynomial of the fifth degree.

DESCRIPTION OF THE PREFERRED EMBODIMENT

Synchronous Data Streaming and the DASD Read and Write Paths

Figure 1:
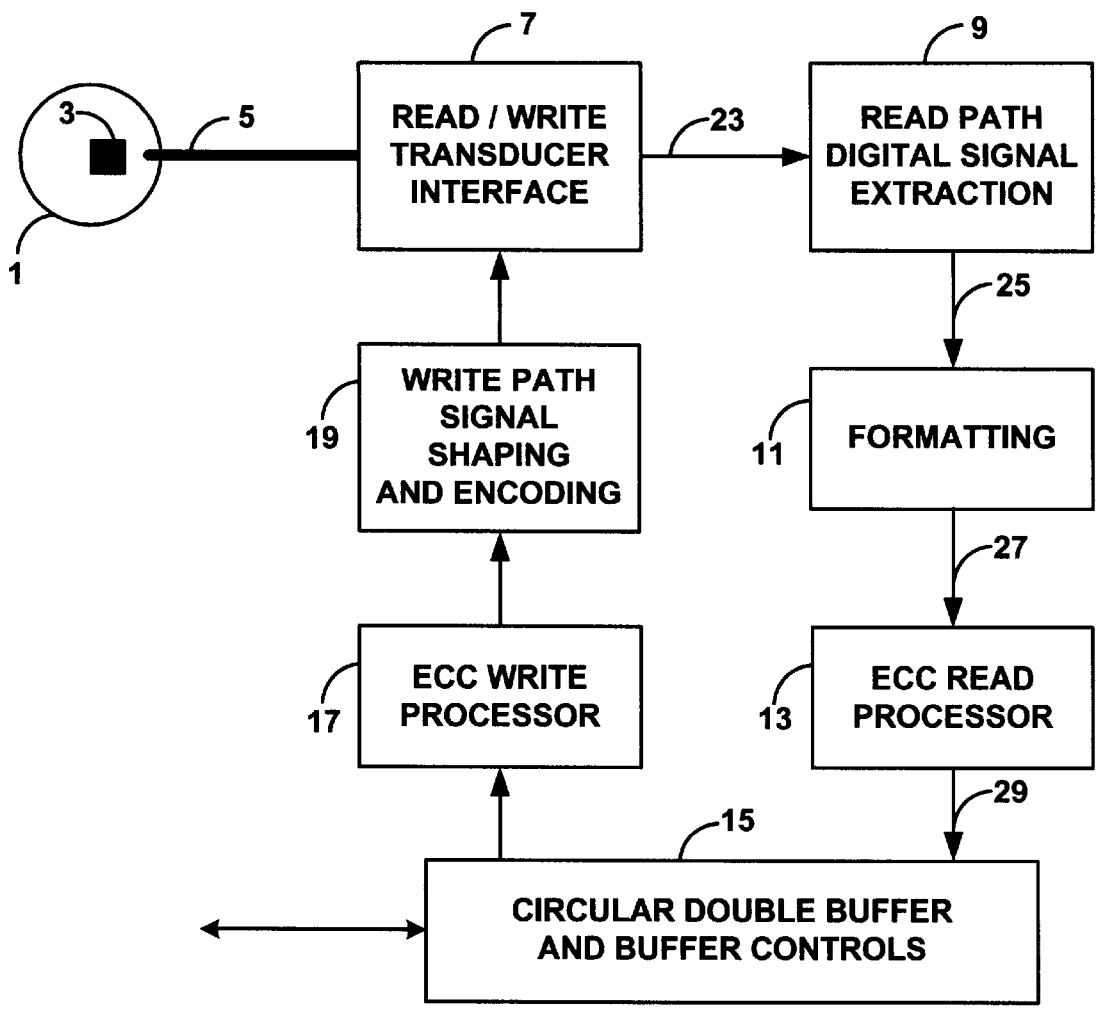
FIG. 1 shows a partial logical view of a disk drive and a portion of the read and write paths according to the prior art.

Referring now to FIG. 1, there is shown a partial logical view of a disk drive and a portion of the read and write paths according to the prior art. A disk drive, also termed a direct access storage device, comprises a cyclically rotated magnetic disk 1, a radial or axially movable access arm 5 tipped with an electromagnetic transducer 3 for either recording magnetic flux patterns representing sequences of digital binary codewords along any one of a predetermined number of concentric tracks on the disk, or reading the recorded flux patterns from a selected one of the tracks and converting them into codewords.

When sequences of digital binary data are to be written out to the disk 1, they are placed temporarily in a buffer 15 and subsequently processed and transduced along a write path or channel (17, 19, 7, 5, and 3) having several stages. First, a predetermined number of binary data elements are moved from the buffer and streamed through the ECC write processor 17 where they are mapped into codewords drawn from a suitable linear block or cyclic code, such as a Reed-Solomon code, as is well appreciated in the prior art. Next, each codeword is mapped in the write path signal-shaping unit 19 into a run-length-limited or other bandpass or spectral-shaping code and into a time-varying signal. The time-varying signal is applied through an interface 7 and thence to the write element in a magnetoresistive or other suitable transducer 3 for conversion into magnetic flux patterns. All of the measures starting from the movement of the binary data elements from buffer 15 until the magnetic flux patterns are written on a selected disk track as the rotating disk 1 passes under the head 3 are synchronous and streamed. For purposes of efficient data transfer, the data is destaged (written out) or staged (read) a disk track at a time. Thus, both the mapping of binary data into Reed-Solomon codewords and the conversion to flux-producing, time-varying signals must be done well within the time interval defining a unit of recording track length moving under the transducer. Typical units of recording track length are equal fixed-length byte sectors of 256 bits or bytes, etc.

When sequences of magnetic flux patterns are to be read from the disk 1, they are processed in a separate so-called read path or channel (7, 9, 11, and 13) and written into buffer 15. The time-varying signals sensed by transducer 3 are passed through the interface 7 to a signal extraction unit 9. Here, the signal is detected and a decision is made as to whether it should be resolved as a binary 1 or 0. As these 1's and 0's stream out of the signal extraction unit 9, they are arranged into codewords in the formatting unit 11. Since the read path is evaluating sequences of RS codewords previously recorded on disk 1, then absent error or erasure, the codewords should be the same. In order to test whether that is the case, each codeword is applied to the ECC read processor 13 over a path 27 from the formatter. Also, the sanitized output from the ECC processor 13 is written into buffer 15 over path 29. The read path must also operate in a synchronous data streaming manner such that any detected errors must be located and corrected within the codeword well in time for the ECC read processor 13 to receive the next codeword read from the disk track. The circular buffer 15 and the read and write paths may be monitored and controlled by a microprocessor (not shown) to ensure efficacy where patterns of referencing may dictate that a path not be taken down, such as sequential read referencing. However, such is beyond the scope of the present invention.

ECC Detection and Correction in the Read Path

Figure 3:
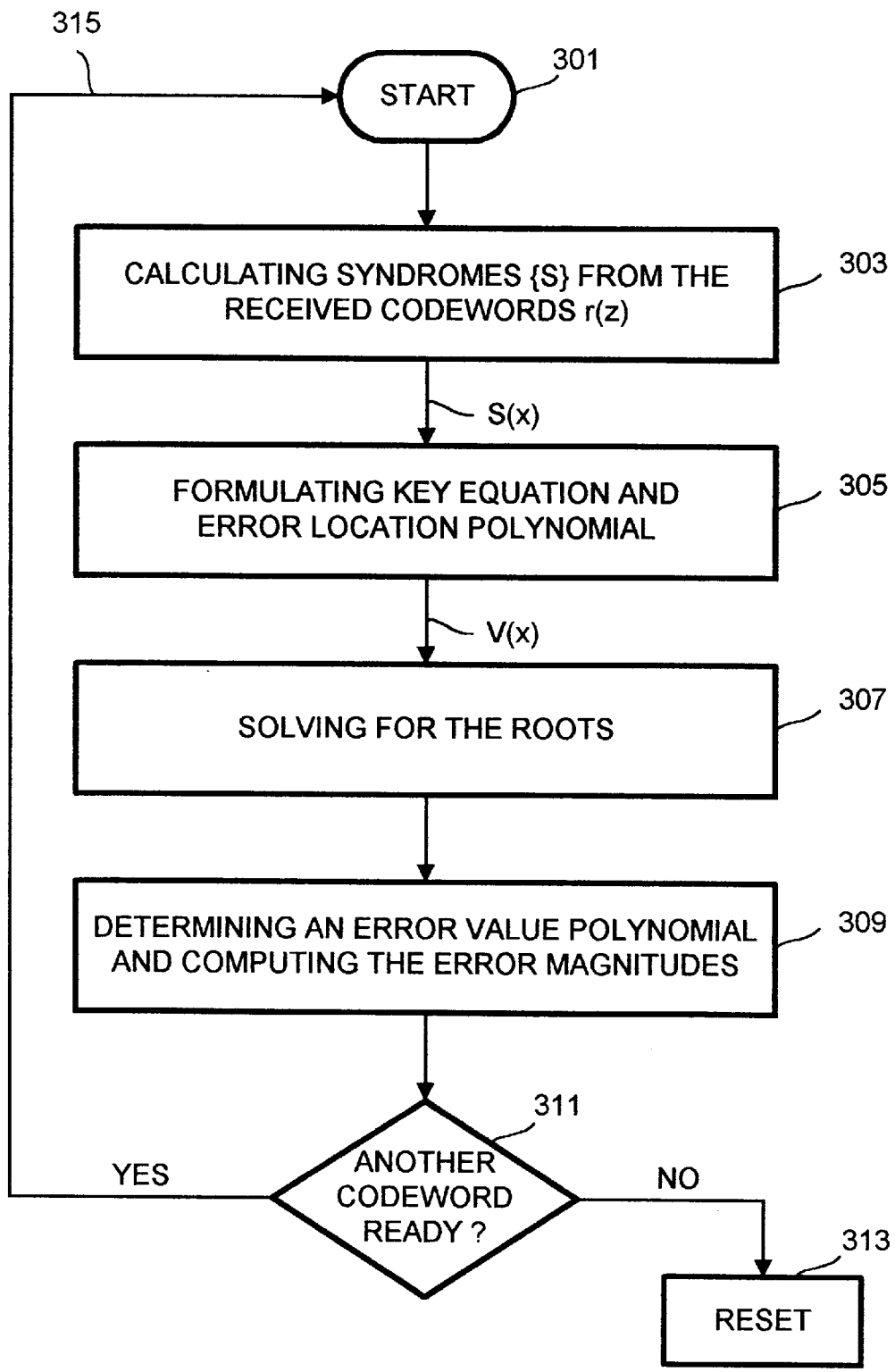
FIG. 3 depicts a flow of control of the general method for detecting and correcting errors and erasures in received codewords in a Reed-Solomon linear cyclic code.

Referring now to FIG. 3, there is shown a flow of control of the general method for detecting and correcting errors and erasure in received codewords in Reed-Solomon linear cyclic codes. At the high level, the method for validating codewords read back from the disk iteratively starts at step 301. It includes calculating the syndromes set $\{S(z)\}$ over each codeword r(z) in step 303, and determining the error locator polynomial f(z) from the syndromes and solving for the roots in step 307. Each iteration is completed in part by ascertaining the error value polynomial and values in step 309, testing in step 311, and repeating over path 315.

Figure 2:
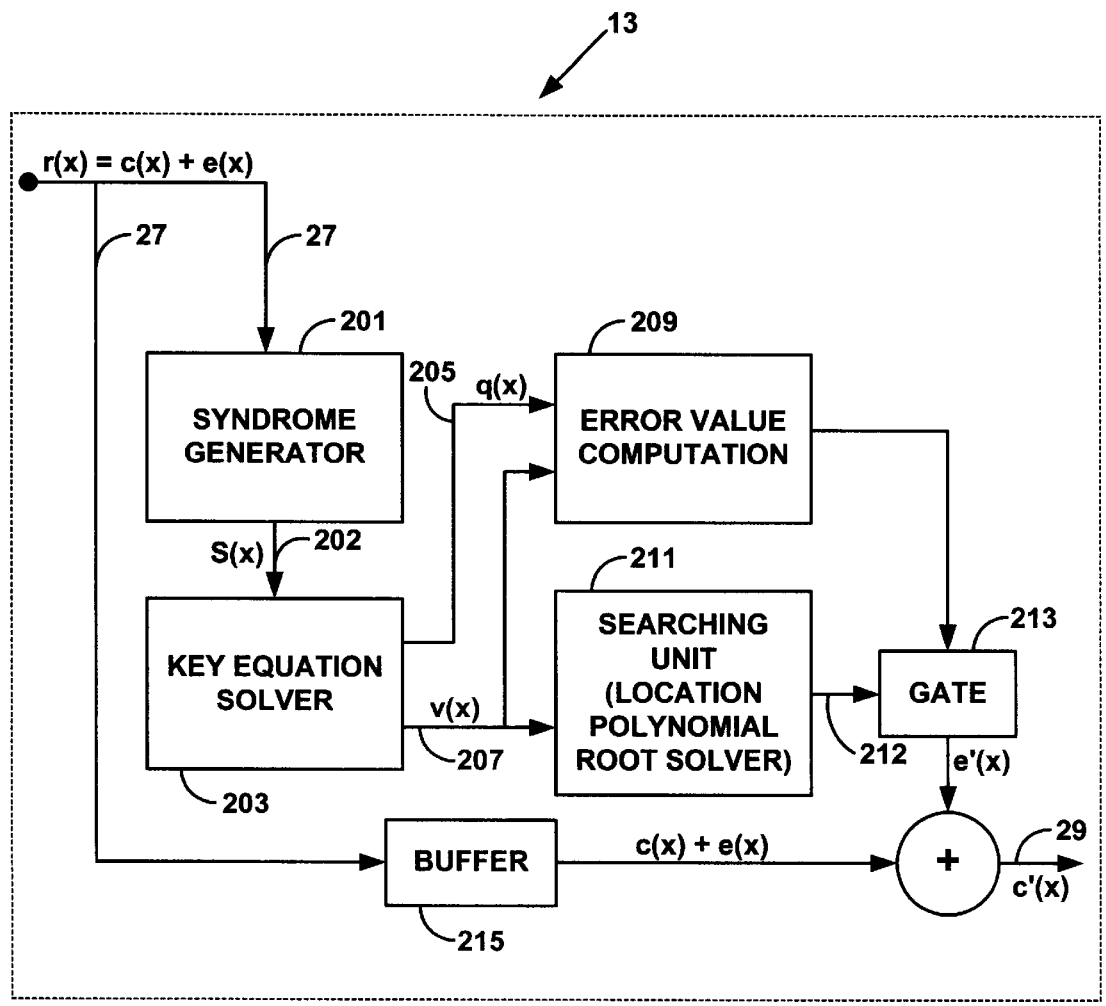
FIG. 2 sets out a portion of the ECC processor in the DASD read path relating to detecting and correcting errors in received codewords according to the prior art.

Referring now to FIG. 2, there is respectively set out a portion of the ECC processor 13 in the DASD read path relating to detecting and correcting errors in received codewords according to the prior art. In the embodiment of FIG. 2, each received codeword r(z) is simultaneously applied over input path 27 to syndrome generator 201 and buffer 215. The purpose of the internal buffer 215 is to ensure that a time-coincident copy of the codeword r(z) is available for modification as the codeword leaves the unit on path 29 for placement in the DASD circular buffer 15 as shown in FIG. 1. The detection of error is provided by the syndrome generator 201. The polynomials constituting the error value and error locations inputs are derived from the syndromes by the key equation solver 203. Next, an error value computation unit 209 and a root solver 211 determine the error values and their locations within the received codeword, respectively. The outputs of the error value computation and the root locations (location within the codeword of the detected errors) are jointly applied through a gate 213 and logically combined with a time-delayed version of r(z) at an OR gate 217. It should be apparent that the root solver 211 is critically positioned. Thus, where the root solver relies only on an iterative substitution of all possible values in a finite Galois field, then a significant amount of time can be expended for root solving for error locator polynomials of even modest degree.

In general, the process represented by the ECC read processor embodiment is an example of time domain decoding and is well appreciated in the prior art. In addition to the Berlekamp and Horiguchi references previously mentioned, attention is also directed to Hassner et al., U.S. Pat. No. 5,428,628, "Modular Implementation for a Parallelized Key Equation Solver for Linear Algebraic Codes", issued Jun. 27, 1995. Hassner and the other references describe designs for respective syndrome detection, key equation solving, error value computation, and most significantly for error location. See also Clark et al., "Error Correction Coding for Digital Communications", Plenum Press, Inc., 1981, pages 189–215.

Root Processing of the Error Locator Polynomial of Degree N from the Key Equation Solver Over a Finite Galois Field $GF(2^m)$ According to the Invention Referring now to FIG. 4, there is shown a general flow of control of the method for finding roots (codeword error locations) in the t degree error locator polynomial f(z) over a finite (Galois) field $GF(2^m)$ as executed in the root solver 211 of ECC read processor 13. The method comprises three processing steps in sequence, namely (1) forming a matrix from a polynomial in step 403, (2) extracting roots in step 405, and (3) computing error values and logically combining them at locations in the counterpart codeword in step 407. This process is iterative in that if there is another f(z) present on path 207 as tested in step 409, then the three steps are repeated as indicated by step 413.

More particularly, the method in FIG. 4 comprises canonically transforming f(z) into an augmented matrix M of a system of linear simultaneous equations in step 403. Next, at least one root is extracted as is a subset of the finite Galois field values as root candidates in step 405. This is accomplished by executing Gaussian Elimination using selective exponentiation as a linear operator over $GF(2^m)$ and determining the remaining roots by iteratively substituting the candidates in the system of equations until said equations are satisfied. Also in step 405, where t≦5, the roots are obtained analytically by executing modified Gaussian Elimination over matrix M. Lastly in step 407, the error values are determined from the syndromes at locations in the received word specified by the extracted roots of the counterpart error locator polynomial f(z) and logically combining them to form a corrected word.

Referring now to FIG. 5A, there is shown a mathematical expression of the information handling steps and transforms depicted in FIG. 4. More particularly, steps 501 and 503 constitute the canonical transformation of an error locator polynomial into a matrix representation M of a system of linear simultaneous equations in step 507. In this regard, step 509 designates the Gaussian Elimination process for root finding, while step 511 shows the extracted roots of f(z).

In broad terms, the process requires mapping an algebraic polynomial $$f(z)=z^t+\Sigma a_{t-k}z^{t-k}$$

of degree t into a system of m linear simultaneous equations with m variables over a finite Galois field GF(2). A matrix representation in which the coefficients $r_j$ of the m unknowns must be some predetermined function of the coefficients of the polynomial f(z). It should be appreciated that all operations are being taken over a finite Galois field. In this invention, advantage is taken of the fact that the operations of squaring and taking a square root are linear operations when executed over a finite Galois field $GF(2^m)$. Inspection of the canonical transformations in step 503 shows the use of the squaring operations in establishing r as a function of α.

In the method and means of this invention, the root solver 211 makes explicit use of the previously mentioned fact that over a finite field $GF(2^n)$, squaring is a linear operation in order to convert the finding of roots into a problem of solving a system of linear equations. Parenthetically, root finding of an algebraic polynomial may also be considered a problem in factoring.

Resolving an Error Locator Polynomial of Degree Four According to the Invention

Illustratively, suppose the error locator polynomial from the key equation solver is a monic polynomial of the fourth degree where:

$$f(z)=z4+Az3+Bz^2+Cz+D=(z-a)(z-b)(z-c)(z-d).$$

The coefficients A, B, C, D of f(z) can be related to the roots a, b, c, d as:

$$A=a+b+c+d$$

$$B=ab+ac+ad+bc+bd+cd$$

$$C=abc+abd+acd+bcd$$

$$D=abcd.$$

A new polynomial g(y) is defined over the finite field such that:

$$g(y)=f(z+\beta)=y^4+A'y^3+B'y^2+C'y+D'$$

$$A'=A$$

$$B'=\beta A+B$$

$$C'=\beta^2 A+C$$

$$D'=\beta^4+\beta^3 A+\beta^2 B+\beta C+D$$

With the appropriate selection of β, the coefficient of the linear term C' can be set to zero. Let $$\beta=[C/A]^{1/2}$$

and since $$C'=\beta^2 A+C=([C/A]^{1/2})^2, A+C=0.$$

Substituting y=1/x into the polynomial g(y) and then multiplying the resulting polynomial by $x^4/D'$ gives:

$$h(x)=x^4+(C'/D')x^3+(B'/D')x^2+(A'/D')x+1/D'=x^4+0*x^3+B''x^2+C''x+D''.$$

This set of transformations constitutes the basis for a computer- or processor-implementable method for taking any fourth degree polynomial with a nonzero coefficient of the cubic term and translating it into a new fourth degree polynomial with a zero coefficient of the cubic term.

It should be appreciated that for each element in the finite Galois field $GF(2^8)$, there exists an 8×8 matrix T which, when multiplied by another element in the field, yields the product of the two elements within the field. There also exists an 8×8 matrix S which, when multiplied by any element in the field, produces a product that is equal to the square of the element. Let S be represented by:

S=
01000000
01101000
00100000
10110100
01010000
01110010
10000000
11010001

Multiplying the S matrix by itself yields a new matrix Q that can be used to raise an element to the fourth power.

$Q=S^2=$
01101000
00011000
00100000
10100110
11011100
01111100
01000000
01001101

The S and Q matrices are available to multiply any variable by any element in the finite field, to square any variable, and to raise any variable to the fourth power. It is now possible to match the form of the polynomial h(x) with a matrix representation.

$$h(x)=x^4+0*x^3+B''x^2+C''x+D''$$

$$=Qx+0+T_{B''}S+T_{C''}x+D''$$

A new matrix M can now be defined as $$M=Q+T_{B''}S+T_{C''}.$$

Combining the two equations yields Mx=D".

The matrix M and the vector finite element D" can be extracted directly from the coefficients returned by the key equation solver 203. Also, the linear system of equations represented by Mx=D" can be solved by Gaussian Elimination. Clearly, the solutions to the linear system of equations will be the roots of the polynomial h(x). Also, the roots of the polynomial h(x) can be translated into the roots of g(y) by simply inverting them.

As may be recalled g(y)=f(z+β). This means the roots of g(y) can be translated into the roots of the error locator polynomial f(z) by adding β modulo 2 addition.

For a fourth degree polynomial with a zero coefficient in the cubic term, the first two transformations of the polynomial can be skipped, and f(z) can be translated directly into matrix form. In this case, the solutions of the linear system of equations are exactly the roots of f(z).

Resolving an Error Locator Polynomial of Degree Three According to the Invention When the key equation solver 203 returns a third degree polynomial, the roots of the polynomial must be shifted to put the polynomial in a form that can be mapped to the matrix form. Thus, let $$f(z)=z^3+Az^2+Bz+C=(z-a)(z-b)(z-c)=z^3-(a+b+c)z^2+(ab+ac+bc)z+abc$$

$A=a+b+c$ $B=ab+ac+bc$ $C=abc$

The roots of a new polynomial g(y) are defined in terms of f(z) and shifted by an amount A defined over a finite field. This may be expressed as:

$$g(y)=f(z+A)=y^3+A'y^2+B'y+C'$$

where

A'=0
$B'=B+A^2$
C'=C+AB

If g(y) is multiplied by y, then it can be translated into a matrix form.

$$yg(y)=y^4+0+B'y^2+C''y$$

$$M=Q+ST_{B'}+T_{C'}$$

$$My=0$$

It should be noted that the set of linear equations is being set equal to zero rather than being set equal to a vector. After the system of equations is solved, then adding A to the solutions yields the roots to f(z).

Resolving an Error Locator Polynomial of Degree Two According to the Invention

Where the error locator polynomial f(z) is of degree two, then the translation of the quadratic equation can be directly made to matrix form. Thus let $$f(z)=z^2+Az+B$$

$$M=S+T_A$$

$$Mz=B$$

The solutions of the linear system are also the roots of the polynomial f(z).

Given only a single error, the solution to f(z) is the single coefficient returned or produced by the key equation solver 203.

Resolving an Error Locator Polynomial of Degree Five and Higher According to the Invention Referring now to FIGS. 5A–5B, there are shown the transformations necessary to generate a matrix representation for a system of linear equations from an error locator polynomial of degree five. In a manner analogous to that described with the polynomial f(z) of degree four, a series of operations completely specified in steps 551, 553, 555, and 557 result in a matrix representation, each of whose coefficients is ultimately a function of the coefficients of f(z). The method and means of the invention yield error locations in step 561 after the Gaussian Elimination step 559 with suitable renormalizations, as discussed above. However, where the degree of the error locator polynomial exceeds five, then the output of the Gaussian Elimination is a mix of at least one solution/root and a subset of candidate solutions or roots drawn from the set of all the values in a given-sized finite Galois field. It is then necessary to iteratively substitute the candidate values, noting the ones that constitute solutions. This still constitutes a substantial processing reduction over a trial-and-error search over all possible values for each received codeword in error.

Aspects of Root Solver Implementation

The root solver 211 can be implemented in the form of a microprocessor with sufficient local RAM to execute a manipulative code segment, preferably written in a high-level programming language such as C to minimize execution time. It can also be implemented in the form of a special purpose finite state machine including an array of flip-flops and associated logic for manipulating the formation of the matrix coefficients in the array and solving the appropriate system of equations by Gaussian Elimination.

The logic in an algorithmic, programming, and hardware sense for canonically forming a matrix representation of a system of linear equations from the error locator polynomial over a finite Galois field, especially for polynomials of degrees one to five, is believed to be well within the skill of the artisan in light of the previous discussion. However, some elucidation is set forth on the algorithmic implementation of the Gaussian Elimination step. Clearly, the following Gaussian Elimination algorithm can be implemented as a segment of C code. C code is recommended over a more general language, such as PASCAL.

Modified Gaussian Elimination Algorithm

The Gaussian Elimination step is directed to finding solutions/roots to the matrix representation derived from the error locator polynomial using modulo 2 arithmetic of a system of linear equations given an n×n binary matrix M and an n-bit vector "a". The n-bit vector is concatenated to the n×n matrix to form an n×(n+1) augmented matrix Ma. The object is to find solutions for the equation Mx=a. The substeps of solution/root extraction by Gaussian Elimination comprise:

(1) Initialize the n×(n+1) matrix Ma.

(2) Scan through the first n columns of Ma from j=0 to n−1.

(3) If Ma(j,j,)=1, then add row j to all the other rows whose column entry is equal to 1. Increment j and return to step 2.

(4) If Ma(j,j)=0, then search for a row k such that Ma(k,j,)=1 and either k>j or Ma(k,k)=0. If no such row exists, then increment j and return to step 2. Otherwise, add the sums of rows k and j to row k, row j and all other rows that have a row in column j.

(5) Read off the solution, if it exists, and the basis for the null space.

At the completion of the Gaussian Elimination step, the solutions/roots of Mx=a will reside in the matrix Ma. In use, both "M" and "a" should be refreshed after each invocation. This avoids any need to store factors and the like.

While the invention has been described with respect to an illustrative embodiment thereof, it will be understood that various changes may be made in the method and means herein described without departing from the scope and teaching of the invention. Accordingly, the described embodiment is to be considered exemplary and the invention is not to be limited except as specified in the attached claims.

What is claimed is:

1. In a system having a source of data words, means for mapping each data word into a codeword selected according a predetermined linear cyclic code, and means for writing said codewords either to a transmission or recording medium, and means responsive to reception of each codeword from a transmission medium or read back from a storage medium for detecting and correcting codewords corrupted by errors, said code having up to a maximum number of consecutive zero or null values occurring in said code definition, wherein said error detection and correction means comprise:

(a) means responsive to the codewords for deriving a set of syndromes $\{S_j\}$;

(b) a Berlekamp-Massey-type key equation solver for deriving coefficients of an error locator polynomial f(z) from the set of syndromes;

(c) a root solver coupling the key equation solver for locating any valid roots to the relation f(z)=0 for a predetermined number of iterations and including:

(1) means for mapping f(z) into a canonical form as an augmented matrix M of a system of linear simultaneous equations in a finite Galois field $GF(2^n)$;

(2) means for extracting the t roots of the error locator polynomial as an algebraic polynomial expression of degree t, where t>5, by executing a Gaussian Elimination process over matrix M using square and square roots as linear operators to obtain at least one root and a subset of the Galois field values as candidates and determining the remaining roots by iteratively substituting the candidate values in the system of equations until said equations are satisfied, and where $t \leq 5$, executing a modified Gaussian Elimination process obtaining $t \leq 5$ roots analytically; and (d) means responsive to the extracted roots error locations for determining error values and for logically combining the error values at the error locations in the received codeword to form a corrected codeword.

2. In a system according to claim 1, wherein the means for determining error values are responsive only to the derived syndromes and the error locator polynomial.

3. In a system according to claim 1, wherein said linear cyclic code is of the Reed-Solomon type, and further wherein the root solver is selected as one member of the set consisting of a programmable microprocessor and a finite state machine.

* * * * *